US010083870B2

(12) United States Patent
Ohori et al.

(10) Patent No.: US 10,083,870 B2
(45) Date of Patent: Sep. 25, 2018

(54) SEMICONDUCTOR DEVICE

(71) Applicant: PANASONIC INTELLECTUAL PROPERTY MANAGEMENT CO., LTD., Osaka (JP)

(72) Inventors: Takahiro Ohori, Osaka (JP); Ayanori Ikoshi, Kyoto (JP); Hiroto Yamagiwa, Hyogo (JP); Manabu Yanagihara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/925,050

(22) Filed: Mar. 19, 2018

(65) Prior Publication Data
US 2018/0211878 A1   Jul. 26, 2018

Related U.S. Application Data

(63) Continuation of application No. PCT/JP2016/004290, filed on Sep. 20, 2016.

(30) Foreign Application Priority Data

Sep. 24, 2015 (JP) ................................. 2015-187370

(51) Int. Cl.
*H01L 29/00* (2006.01)
*H01L 21/8232* (2006.01)
(Continued)

(52) U.S. Cl.
CPC .......... *H01L 21/8232* (2013.01); *H01L 27/06* (2013.01); *H01L 27/095* (2013.01);
(Continued)

(58) Field of Classification Search
CPC .............................. H01L 29/861; H01L 29/747
See application file for complete search history.

(56) References Cited

U.S. PATENT DOCUMENTS

| 8,039,954 B2* | 10/2011 | Osawa | .............. | H01L 23/49562 257/712 |
| 2010/0213510 A1* | 8/2010 | Osawa | .............. | H01L 23/49562 257/146 |

(Continued)

FOREIGN PATENT DOCUMENTS

JP    2011-165749 A    8/2011

OTHER PUBLICATIONS

International Search Report and Written Opinion issued in International Patent Application No. PCT/JP2016/004290 dated Dec. 13, 2016; with partial English translation.

*Primary Examiner* — Nicholas Tobergte
(74) *Attorney, Agent, or Firm* — McDermott Will & Emery LLP

(57) ABSTRACT

A semiconductor device includes: a first bidirectional switch element including a first gate electrode, a second gate electrode, a first electrode, and a second electrode; a first field-effect transistor including a third gate electrode, a third electrode, and a fourth electrode; and a second field-effect transistor including a fourth gate electrode, a fifth electrode, and a sixth electrode. The first electrode is electrically connected to the third gate electrode, the first gate electrode is electrically connected to the third electrode, the second electrode is electrically connected to the fourth gate electrode, the second gate electrode is electrically connected to the fifth electrode, and the fourth electrode is electrically connected to the sixth electrode.

20 Claims, 12 Drawing Sheets

(51) Int. Cl.

| | |
|---|---|
| *H01L 27/06* | (2006.01) |
| *H01L 27/095* | (2006.01) |
| *H01L 27/098* | (2006.01) |
| *H01L 29/872* | (2006.01) |
| *H01L 29/808* | (2006.01) |
| *H01L 29/812* | (2006.01) |
| *H01L 29/868* | (2006.01) |
| *H01L 29/778* | (2006.01) |
| *H01L 29/747* | (2006.01) |
| *H01L 29/861* | (2006.01) |

(52) U.S. Cl.
CPC .......... *H01L 27/098* (2013.01); *H01L 29/778* (2013.01); *H01L 29/808* (2013.01); *H01L 29/812* (2013.01); *H01L 29/868* (2013.01); *H01L 29/872* (2013.01); *H01L 29/747* (2013.01); *H01L 29/861* (2013.01)

(56) References Cited

U.S. PATENT DOCUMENTS

2011/0193171 A1   8/2011   Yamagiwa et al.
2015/0287713 A1*  10/2015  Morita ................ H01L 29/7787
                                                   257/356

* cited by examiner

SEMICONDUCTOR DEVICE

CROSS REFERENCE TO RELATED APPLICATIONS

This application is a U.S. continuation application of PCT International Patent Application Number PCT/JP2016/004290 filed on Sep. 20, 2016, claiming the benefit of priority of Japanese Patent Application Number 2015-187370 filed on Sep. 24, 2015, the entire contents of which are hereby incorporated by reference.

BACKGROUND

1. Technical Field

The present disclosure relates to semiconductor devices, and particularly to a semiconductor device including a protection element.

2. Description of the Related Art

From recent global warming control and environmental regulation points of view, there is a demand for energy conservation for electrical equipment, and the power loss of inverters, matrix converters, etc., which convert electric power is expected to be reduced. In particular, the matrix converters are capable of alternating-current (AC)-AC power conversion without using a diode rectifier and thus, the power loss thereof can be expected to be significantly reduced.

In recent years, the use of a bidirectional switch including a compound semiconductor, particularly, a nitride semiconductor, for the matrix converters has been actively researched. The nitride semiconductor includes a compound composed of boron (B), indium (In), aluminum (Al), or gallium (Ga), which is a group-III element, and nitrogen (N) which is a group-V element, and expressed by the chemical formula $B_w In_x Al_y Ga_z N$ where $w+x+y+z=1$ and $0 \leq w, x, y, z \leq 1$.

Especially, gallium nitride (GaN) has a band gap of 3.4 eV, which is approximately three times wider than the band gap of silicon (Si), and thus is superior in terms of high voltage resistance. This allows a reduction in element size, allowing a reduction in the ON-resistance during operation. Therefore, the use of the bidirectional switch including the compound semiconductor for the matrix converters allows a reduction in conduction loss, which can lead to a high-efficiency AC-AC power conversion circuit.

However, the bidirectional switch including the compound semiconductor has constraints of the resistance of a gate electrode to surges. Gate structures of the metal-semiconductor type and the junction type are typical for the bidirectional switch including the compound semiconductor. Both the metal-semiconductor switch and the junction switch have a high resistance to surges for applying a positive bias to a gate electrode and a negative bias to an ohmic electrode and have a low resistance to surges for applying a negative bias to a gate electrode and a positive bias to the ohmic electrode. In addition, the bidirectional switch has a low resistance to both positive and negative surges occurring between two gate electrodes thereof. Thus, in the bidirectional switch including the compound semiconductor, there is a trade-off between a reduction in element size and high resistance to surges.

The option of adding a surge protection transistor has been studied as a method of improving the resistance of a gate electrode of a bidirectional switch including a compound semiconductor to surges (refer to Japanese Unexamined Patent Application Publication No. 2011-165749, for example).

SUMMARY

However, in the above-mentioned existing method of improving the resistance of a gate electrode of the bidirectional switch to surges, the resistance to surges between the two gate electrodes cannot be improved while the resistance to surges between a gate electrode and the ohmic electrode can be improved.

The present disclosure has an object to solve the aforementioned problem and provide a semiconductor device of the bidirectional switch type with improved resistance to surges between a first gate electrode and a second gate electrode.

In order to achieve the aforementioned object, the semiconductor device according to one aspect of the present disclosure includes: a bidirectional switch element; a first protection element; and a second protection element. The bidirectional switch element includes: a first compound semiconductor layer of n-type conductivity above a first substrate; a first electrode and a second electrode on the first compound semiconductor layer; a first gate electrode between the first electrode and the second electrode; and a second gate electrode between the first gate electrode and the second electrode. Conduction between the first electrode and the second electrode is controlled by voltages at the first gate electrode and the second gate electrode. The first protection element includes: a second compound semiconductor layer of the n-type conductivity above a second substrate; a third electrode and a fourth electrode on the second compound semiconductor layer; and a third gate electrode between the third electrode and the fourth electrode. Conduction between the third electrode and the fourth electrode is controlled by a voltage at the third gate electrode. The second protection element includes: a third compound semiconductor layer of the n-type conductivity above a third substrate; a fifth electrode and a sixth electrode on the third compound semiconductor layer; and a fourth gate electrode between the fifth electrode and the sixth electrode. Conduction between the fifth electrode and the sixth electrode is controlled by a voltage at the fourth gate electrode. The sum of a withstand voltage between the fourth electrode and one of the third electrode and the third gate electrode and a withstand voltage between the sixth electrode and one of the fifth electrode and the fourth gate electrode is greater than or equal to a maximum applicable voltage between one of the first electrode and the first gate electrode and one of the second electrode and the second gate electrode. The first gate electrode and the second gate electrode form one of Schottky junction and p-n junction with the first compound semiconductor layer. The third gate electrode forms one of the Schottky junction and the p-n junction with the second compound semiconductor layer. The fourth gate electrode forms one of the Schottky junction and the p-n junction with the third compound semiconductor layer. The first electrode is electrically connected to the third gate electrode. The first gate electrode is electrically connected to the third electrode. The second electrode is electrically connected to the fourth electrode. The second gate electrode is electrically connected to the fifth electrode. The fourth electrode is electrically connected to the sixth electrode.

Here, the first protection element and the second protection element function as a protector against the surge voltage applied to the bidirectional switch element.

In the semiconductor device having the abovementioned structure, consider the case where between the first gate electrode and the second gate electrode of the bidirectional switch element, a surge that is positive with respect to the second gate electrode is applied to the first gate electrode. Capacitive coupling to the third electrode connected to the first gate electrode causes an increase in the potential at the third gate electrode that is being a floating electrode, and thus the first field-effect transistor is turned ON. This allows the positive surge current applied to the first gate electrode to flow to the fourth electrode through the third electrode. Subsequently, the surge current that has flowed to the fourth electrode causes the potential at the fourth gate electrode that is being a floating electrode to increase by capacitive coupling to the sixth electrode connected to the fourth electrode. Thus, the second protection element is turned ON. Accordingly, the surge current that has flowed to the fourth electrode can flow to the second gate electrode through the sixth electrode and the fifth electrode.

Conversely, when a surge that is positive with respect to the first gate electrode is applied to the second gate electrode, the surge current can flow to the first gate electrode likewise.

Thus, the positive and negative surge voltages generated between the first gate electrode and the second gate electrode can be reduced.

Furthermore, the semiconductor device according to one aspect of the present disclosure includes: a bidirectional switch element; and a protection element. The bidirectional switch element includes: a first compound semiconductor layer of n-type conductivity above a first substrate; a first electrode and a second electrode on the first compound semiconductor layer; a first gate electrode between the first electrode and the second electrode; and a second gate electrode between the first gate electrode and the second electrode. Conduction between the first electrode and the second electrode is controlled by voltages at the first gate electrode and the second gate electrode. The protection element includes: a fourth compound semiconductor layer of the n-type conductivity above a second substrate; a seventh electrode and an eighth electrode on the fourth compound semiconductor layer; a fifth gate electrode between the seventh electrode and the eighth electrode; and a sixth gate electrode between the fifth gate electrode and the eighth electrode. Conduction between the seventh electrode and the eighth electrode is controlled by voltages at the fifth gate electrode and the sixth gate electrode. A withstand voltage between two electrodes of the protection element that include one of the seventh electrode and the fifth gate electrode and one of the eighth electrode and the sixth gate electrode is greater than or equal to a maximum applicable voltage between two electrodes of the bidirectional switch element that include one of the first electrode and the first gate electrode and one of the second electrode and the second gate electrode. The first gate electrode and the second gate electrode form one of Schottky junction and p-n junction with the first compound semiconductor layer. The fifth gate electrode and the sixth gate electrode form one of the Schottky junction and the p-n junction with the fourth compound semiconductor layer. The first electrode is electrically connected to the fifth gate electrode. The second electrode is electrically connected to the sixth gate electrode. The first gate electrode is electrically connected to the seventh electrode. The second gate electrode is electrically connected to the eighth electrode.

Here, the protection element functions as a protector against the surge voltage applied to the bidirectional switch element.

In the semiconductor device having the abovementioned structure, consider the case where between the first gate electrode and the second gate electrode of the bidirectional switch element, a surge that is positive with respect to the second gate electrode is applied to the first gate electrode. Capacitive coupling to the seventh electrode connected to the first gate electrode causes an increase in the potential at the fifth gate electrode and the sixth gate electrode that are being a floating electrode, and thus the protection element is turned ON. Accordingly, the surge current can flow from the first gate electrode to the second gate electrode through the seventh electrode and the eighth electrode.

Conversely, when a surge that is positive with respect to the first gate electrode is applied to the second gate electrode, the surge current can flow to the first gate electrode likewise.

Thus, the positive and negative surge voltages generated between the first gate electrode and the second gate electrode can be reduced.

With the semiconductor device according to the present disclosure, it is possible to improve the resistance to surges between the first gate electrode and the second gate electrode of the bidirectional switch element.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Hereinafter, semiconductor devices according to embodiments of the present disclosure will be described with reference to the drawings. Note that each of the following embodiments shows one specific example of the present disclosure; the numerical values, shapes, materials, structural elements, the arrangement and connection of the structural elements, etc., shown in the following embodiments are mere examples, and are not intended to limit the present disclosure.

Embodiment 1

Semiconductor device 1 according to Embodiment 1 of the present disclosure will be described below with reference to the drawings.

Figure 1:
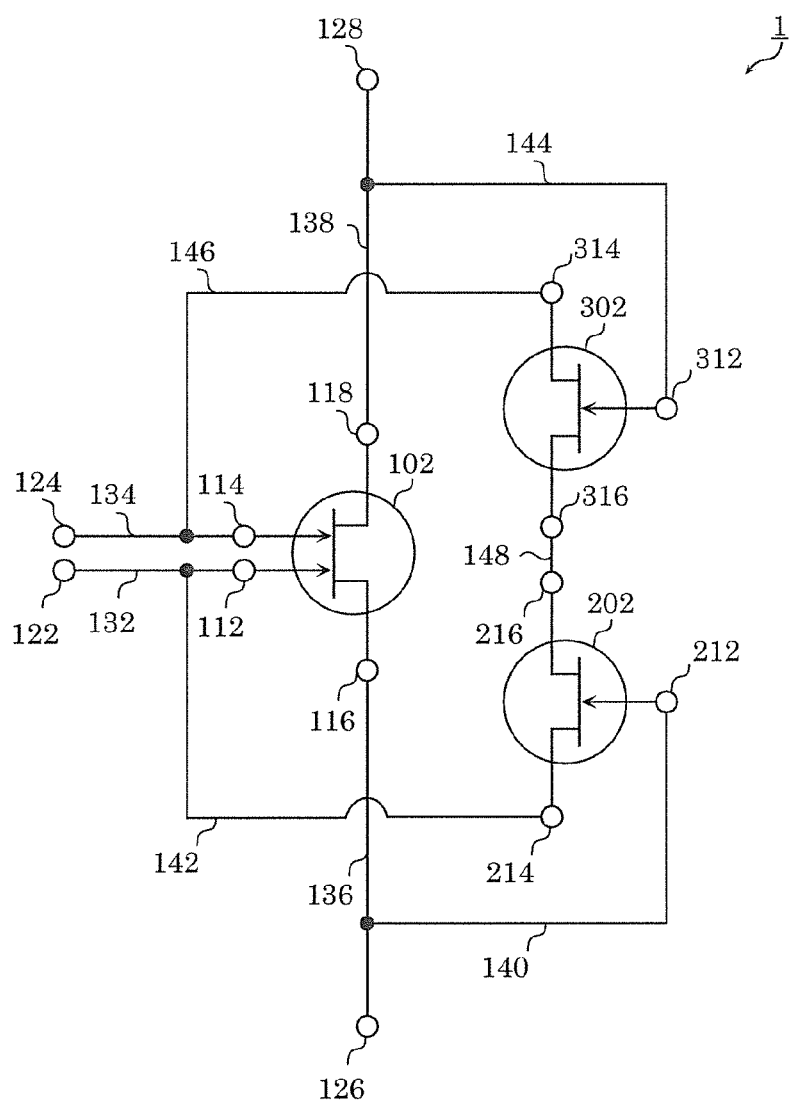
FIG. 1 is an equivalent circuit diagram illustrating a semiconductor device according to Embodiment 1.
Figure 2:
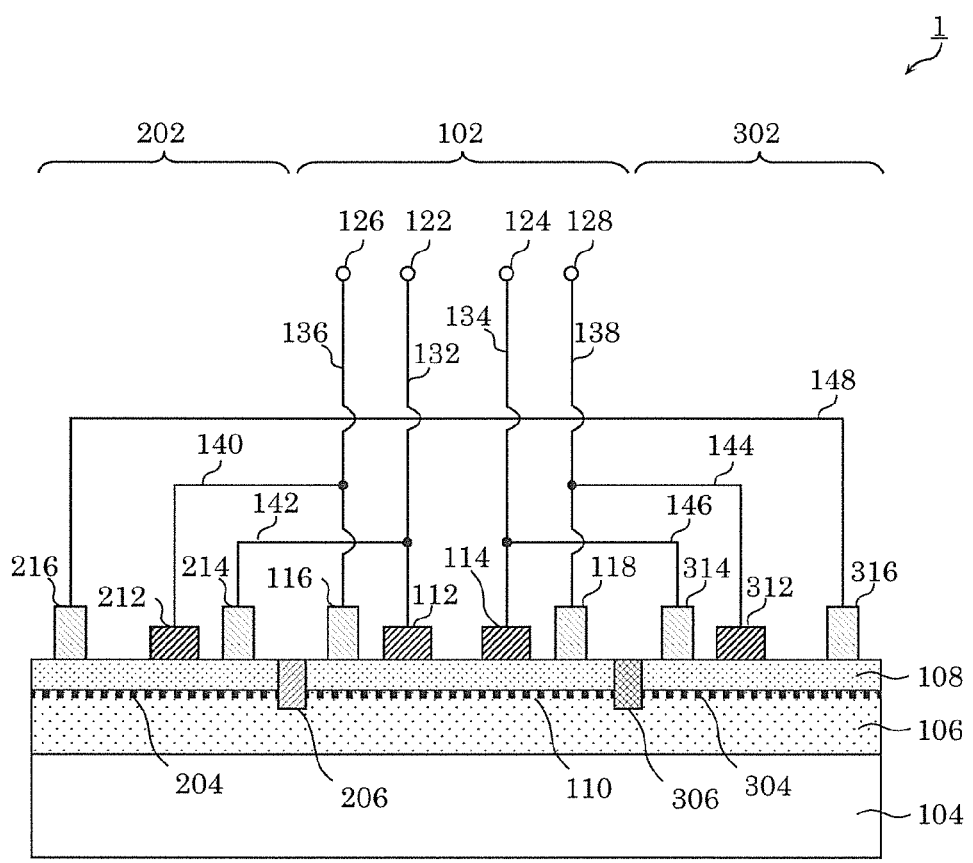
FIG. 2 is a cross-sectional view illustrating a semiconductor device according to Embodiment 1.

As illustrated in FIG. 1 and FIG. 2, semiconductor device 1 according to the present embodiment includes first bidirectional switch element 102, first field-effect transistor 202, and second field-effect transistor 302. First bidirectional switch element 102 controls conduction between first electrode 116 (first ohmic electrode) and second electrode 118 (second ohmic electrode) by first gate electrode 112 and second gate electrode 114. First field-effect transistor 202 and second field-effect transistor 302 are respectively the first protection element and the second protection element which protect first bidirectional switch element 102.

As illustrated in FIG. 2, in the present embodiment, 1 µm to 2 µm-thick undoped GaN channel layer 106 and 50 nm-thick undoped AlGaN barrier layer 108 are formed in this order above substrate 104 made of silicon. Herein, "undoped" means the state where impurities are not intentionally introduced, therefore including the state where impurities such as carbon are unintentionally introduced. In this case, the carbon impurity concentration is desirably not higher than $1 \times 10^{14}$ cm$^{-3}$. When barrier layer 108 is stacked on channel layer 106, spontaneous polarization or piezoelectric polarization causes highly concentrated two-dimensional electron gas to be generated at the junction interface, and thus first channel region 110, second channel region 204, and third channel region 304 are formed.

$Al_aGa_{1-a}N$ ($0 \leq a \leq 1$) is used as the material of channel layer 106, and $Al_bGa_{1-b}N$ ($0 \leq b \leq 1$ and b>a) is used as the material of barrier layer 108. In the present embodiment, for example, GaN (that is, a=0) is used as the material of channel layer 106 and, for example, $Al_{0.2}Ga_{0.8}N$ (that is, b=0.2) is used as the material of barrier layer 108.

Second channel region 204 is separated from first channel region 110 by providing first element isolation region 206. Third channel region 304 is separated from first channel region 110 and second channel region 204 by providing second element isolation region 306. First element isolation region 206 and second element isolation region 306 may be formed by implanting boron ions, iron ions, or other ions into channel layer 106 and barrier layer 108.

First electrode 116, second electrode 118, first gate electrode 112, which is positioned between first electrode 116 and second electrode 118, and second gate electrode 114, which is positioned between first gate electrode 112 and second electrode 118, are formed on channel layer 106 with barrier layer 108 (first compound semiconductor layer of n-type conductivity). It is sufficient that first electrode 116 and second electrode 118 be in ohmic contact with first channel region 110; a recess may be provided. Specifically, first electrode 116 and second electrode 118 may, for example, each be made of one kind of metal selected from Ti, Al, Mo, Hf, and the like or have a layered structure including a combination of two or more of these kinds of metal. Thus, first bidirectional switch element 102 having first channel region 110 as a channel is provided.

First gate electrode 112, second gate electrode 114, first electrode 116, and second electrode 118 are connected to first external gate terminal 122, second external gate terminal 124, first external terminal 126, and second external terminal 128 via line 132, line 134, line 136, and line 138, respectively.

In addition, third electrode 214 (third ohmic electrode), fourth electrode 216 (fourth ohmic electrode), and third gate electrode 212, which is positioned between third gate electrode 214 and fourth electrode 216, are formed on channel layer 106 with barrier layer 108 (second compound semiconductor layer of n-type conductivity). It is sufficient that third electrode 214 and fourth electrode 216 be in ohmic contact with second channel region 204; a recess may be provided. Specifically, third electrode 214 and fourth electrode 216 may, for example, each be made of one kind of metal selected from Ti, Al, Mo, Hf, and the like or have a layered structure including a combination of two or more of these kinds of metal. Thus, first field-effect transistor 202 having second channel region 204 as a channel is provided.

In addition, fifth electrode 314 (fifth ohmic electrode), sixth electrode 316 (sixth ohmic electrode), and fourth gate electrode 312, which is positioned between fifth electrode 314 and sixth electrode 316, are formed on channel layer 106 with barrier layer 108 (third compound semiconductor layer of n-type conductivity). It is sufficient that fifth electrode 314 and sixth electrode 316 be in ohmic contact with third channel region 304; a recess may be provided. Specifically, fifth electrode 314 and sixth electrode 316 may, for example, each be made of one kind of metal selected from Ti, Al, Mo, Hf, and the like or have a layered structure including a combination of two or more of these kinds of metal. Thus, second field-effect transistor 302 having third channel region 304 as a channel is provided.

First electrode 116 is connected to third gate electrode 212 via line 140. First gate electrode 112 is connected to third electrode 214 via line 142. Second electrode 118 is connected to fourth gate electrode 312 via line 144. Second gate electrode 114 is connected to fifth electrode 314 via line 146. Fourth electrode 216 is electrically connected to sixth electrode 316 via line 148.

Here, assume that the maximum applicable voltage between one of first electrode 116 and first gate electrode 112 and one of second electrode 118 and second gate electrode 114 in first bidirectional switch element 102 illustrated in FIG. 1 and FIG. 2 is denoted as Vmax, the withstand voltage between fourth electrode 216 and one of third electrode 214 and third gate electrode 212 in first field-effect transistor 202 is denoted as Vb1, and the withstand voltage between sixth electrode 316 and one of fifth electrode 314 and fourth gate electrode 312 in second field-effect transistor 302 is denoted as Vb2. In this case, first bidirectional switch element 102, first field-effect transistor 202, and second field-effect transistor 302 are designed so as to satisfy the following expression.

$$V\text{max} < Vb1 + Vb2 \quad \text{(Expression 1)}$$

With such designs, first field-effect transistor 202 and second field-effect transistor 302 have no impact on normal switching operations of first bidirectional switch element 102. Note that the maximum applicable voltage Vmax herein for first bidirectional switch element 102 is the highest possible voltage that can be applied to the element during the normal switching operation and has a lower value than the withstand voltage of the element.

In particular, the element including GaN has a low avalanche resistance and therefore is designed to have a withstand voltage of approximately 1,000 V when the maximum applicable voltage Vmax for first bidirectional switch element 102 is 600 V, for example. In this case, Vb1 and Vb2 each need to be designed to have, for example, a value of at least 300 V. In order to reduce the unnecessary leakage current flowing through the protection element, Vb1 and Vb2 are more preferably designed to have a value equivalent to no less than 1,000 V, which is the withstand voltage of first bidirectional switch element 102.

As a more specific element design, the sum of the distance between third gate electrode 212 and fourth electrode 216 in first field-effect transistor 202 and the distance between fourth gate electrode 312 and sixth electrode 316 in second field-effect transistor 302 is preferably set greater than or equal to the distance between first gate electrode 112 and second gate electrode 114 in first bidirectional switch element 102. This is because the withstand voltage is approximately proportional to the distance between electrodes in the field-effect transistor including GaN.

Consider the case where between first gate electrode 112 and second gate electrode 114 of first bidirectional switch element 102, a surge that is positive with respect to second gate electrode 114 is applied to first gate electrode 112 through first external gate terminal 122 and second external gate terminal 124. At this time, capacitive coupling to third electrode 214 connected to first gate electrode 112 causes an increase in the potential at third gate electrode 212 that is being a floating electrode, and thus first field-effect transistor 202 is turned ON. This allows the positive surge current applied to first gate electrode 112 to flow to fourth electrode 216 through third electrode 214. Subsequently, the surge current that has flowed to fourth electrode 216 causes the potential at fourth gate electrode 312 that is being a floating electrode to increase by capacitive coupling to sixth electrode 316 connected to fourth electrode 216. Thus, second field-effect transistor 302 is turned ON. Accordingly, the surge current that has flowed to fourth electrode 216 can flow to second gate electrode 114 through sixth electrode 316 and fifth electrode 314.

Conversely, when a surge that is positive with respect to first gate electrode 112 is applied to second gate electrode 114 through first external gate terminal 122 and second external gate terminal 124, the surge current can flow to first gate electrode 112 through fifth electrode 314, sixth electrode 316, fourth electrode 216, and third electrode 214.

Thus, the positive and negative surge voltages generated between first gate electrode 112 and second gate electrode 114 can be reduced.

In the present embodiment, third gate electrode 212 is preferably made of a material having a function for passing an electric current from third gate electrode 212 toward second channel region 204.

With this, it is possible to improve the resistance to a surge causing a positive bias to be applied to first electrode 116 between first gate electrode 112 and first electrode 116, and it is possible to improve the resistance to a surge causing a positive bias to be applied to first electrode 116 between second gate electrode 114 and first electrode 116.

First, consider the case where between first gate electrode 112 and first electrode 116 of first bidirectional switch element 102, a positive surge is applied to first electrode 116 through first external gate terminal 122 and first external terminal 126. At this time, since first field-effect transistor 202 has a function for passing an electric current from third gate electrode 212 toward second channel region 204, the positive surge applied to first electrode 116 can result in a surge current flowing from third gate electrode 212 to first gate electrode 112 through third electrode 214. Thus, it is possible to improve the resistance to a surge causing a positive bias to be applied to first electrode 116 between first gate electrode 112 and first electrode 116.

Subsequently, consider the case where between second gate electrode 114 and first electrode 116 of first bidirectional switch element 102, a positive surge is applied to first electrode 116 through second external gate terminal 124 and first external terminal 126. At this time, since first field-effect transistor 202 has a function for passing an electric current from third gate electrode 212 toward second channel region 204, the positive surge applied to first electrode 116 can result in a surge current flowing from third gate electrode 212 to fourth electrode 216. The surge current that has flowed to fourth electrode 216 causes the potential at fourth gate electrode 312 that is being a floating electrode to increase by capacitive coupling to sixth electrode 316 connected to fourth electrode 216. Thus, second field-effect transistor 302 is turned ON. Accordingly, the surge current that has flowed to fourth electrode 216 can flow to second gate electrode 114 through sixth electrode 316 and fifth electrode 314. Thus, it is possible to improve the resistance to a surge causing a positive bias to be applied to first electrode 116 between second gate electrode 114 and first electrode 116.

Third gate electrode 212 may, for example, be made of one kind of metal selected from Ti, Al, Ni, Pt, Pd, Au, Mo, Hf, and the like or have a layered structure including a combination of two or more of these kinds of metal and form Schottky junction with barrier layer 108, or may be made of one kind of metal selected from Ti, Al, Ni, Pt, Pd, Au, Mo, Hf, and the like or have a layered structure including a combination of two or more of these kinds of metal on a p-type semiconductor formed on the channel layer 106 side. In the present embodiment, in the case of using the layered structure of the p-type semiconductor and the metal for third gate electrode 212, the p-type semiconductor includes, for example, magnesium (Mg)-doped p-type $In_cAl_dGa_{1-(c+d)}N$ ($0 \leq c \leq 1$, $0 \leq d \leq 1$, and $c+d \leq 1$), and preferably includes p-type GaN (that is, $c=d=0$).

Furthermore, in the present embodiment, as with third gate electrode 212, fourth gate electrode 312 is preferably made of a material having a function for passing an electric current from fourth gate electrode 312 toward third channel region 304.

With this, similar to above, it is possible to improve the resistance to a surge causing a positive bias to be applied to second electrode 118 between second gate electrode 114 and second electrode 118, and it is possible to improve the resistance to a surge causing a positive bias to be applied to second electrode 118 between first gate electrode 112 and second electrode 118.

In the present embodiment, first gate electrode 112 is preferably made of a material having a function for passing an electric current from first gate electrode 112 toward first channel region 110.

With this, it is possible to improve the resistance to a surge causing a positive bias to be applied to first gate electrode 112 between first gate electrode 112 and first electrode 116, and it is possible to improve the resistance to a surge causing a positive bias to be applied to first gate electrode 112 between first gate electrode 112 and second electrode 118.

First, consider the case where between first gate electrode 112 and first electrode 116 of first bidirectional switch element 102, a positive surge is applied to first gate electrode 112 through first external gate terminal 122 and first external terminal 126. At this time, since first bidirectional switch element 102 has a function for passing an electric current from first gate electrode 112 toward first channel region 110, the positive surge applied to first gate electrode 112 can result in a surge current flowing from first gate electrode 112 to first electrode 116. Thus, it is possible to improve the resistance to a surge causing a positive bias to be applied to first gate electrode 112 between first gate electrode 112 and first electrode 116.

Subsequently, consider the case where between first gate electrode 112 and second electrode 118 of first bidirectional switch element 102, a positive surge is applied to first gate electrode 112 through first external gate terminal 122 and second external terminal 128. At this time, first bidirectional switch element 102 has a function for passing an electric current from first gate electrode 112 toward first channel region 110, and second gate electrode 114 is a floating electrode. Therefore, the surge applied to first gate electrode 112 can result in a surge current flowing to second electrode 118. Thus, it is possible to improve the resistance to a surge causing a positive bias to be applied to first gate electrode 112 between first gate electrode 112 and second electrode 118.

First gate electrode 112 may, for example, be made of one kind of metal selected from Ti, Al, Ni, Pt, Pd, Au, Mo, Hf, and the like or have a layered structure including a combination of two or more of these kinds of metal and form Schottky junction with barrier layer 108, or may be made of one kind of metal selected from Ti, Al, Ni, Pt, Pd, Au, Mo, Hf, and the like or have a layered structure including a combination of two or more of these kinds of metal on a p-type semiconductor formed on the channel layer 106 side. In the present embodiment, in the case of using the layered structure of the p-type semiconductor and the metal for first gate electrode 112, the p-type semiconductor includes, for example, magnesium (Mg)-doped p-type $In_gAl_hGa_{1-(g+h)}N$ ($0 \le g \le 1$, $0 \le h \le 1$, and $g+h \le 1$), and preferably includes p-type GaN (that is, $g=h=0$).

Furthermore, in the present embodiment, as with first gate electrode 112, second gate electrode 114 is preferably made of a material having a function for passing an electric current from second gate electrode 114 toward first channel region 110.

With this, similar to above, it is possible to improve the resistance to a surge causing a positive bias to be applied to second gate electrode 114 between second gate electrode 114 and second electrode 118, and it is possible to improve the resistance to a surge causing a positive bias to be applied to second gate electrode 114 between second gate electrode 114 and first electrode 116.

In the present embodiment, first field-effect transistor 202 and second field-effect transistor 302 are preferably normally-off field-effect transistors. With this, when the voltage between first electrode 116 and first gate electrode 112 and the voltage between second electrode 118 and second gate electrode 114 in first bidirectional switch element 102 are 0 V, the voltage between third gate electrode 212 and third electrode 214 and the voltage between fourth gate electrode 312 and fifth electrode 314 are also 0 V. Thus, first field-effect transistor 202 and second field-effect transistor 302 are in OFF state, having no adverse effect on operations of first bidirectional switch element 102.

Furthermore, first bidirectional switch element 102 may be a normally-off bidirectional switch element. With this, when semiconductor device 1 is used as a power switching element, an accident such as an electrical short circuit can be prevented even if a failure occurs in a gate drive circuit, and thus the security of the device can be ensured.

Furthermore, the process of fabricating an electrode in first field-effect transistor 202 and second field-effect transistor 302 may be the same as that in first bidirectional switch element 102. With this, the manufacturing process can be simplified.

Furthermore, first field-effect transistor 202 and second field-effect transistor 302 may be smaller in element size than first bidirectional switch element 102. This makes it possible to reduce the increase in parasitic capacitance of first bidirectional switch element 102 that is due to added first field-effect transistor 202 and second field-effect transistor 302. Specifically, the element size of first field-effect transistor 202 and second field-effect transistor 302 is preferably about one hundredth of the element size of first bidirectional switch element 102.

Furthermore, channel layer 106 and barrier layer 108 in first field-effect transistor 202 and second field-effect transistor 302 may be made of a material different from that of channel layer 106 and barrier layer 108 in first bidirectional switch element 102. In other words, each of first field-effect transistor 202 and second field-effect transistor 302 may be a semiconductor element made of a material different from that of first bidirectional switch element 102 while sharing substrate 104.

Furthermore, substrate 104 (second substrate) in first field-effect transistor 202 and substrate 104 (third substrate) in second field-effect transistor 302 may be different from substrate 104 (first substrate) in first bidirectional switch element 102; these elements may be fabricated in different manufacturing processes using separate substrates.

Furthermore, instead of substrate 104 made of silicon, a sapphire substrate, a SiC substrate, a GaN substrate, or the like may be used, for example.

Embodiment 2

Semiconductor device 2 according to Embodiment 2 of the present disclosure will be described below with reference to the drawings.

Figure 3:
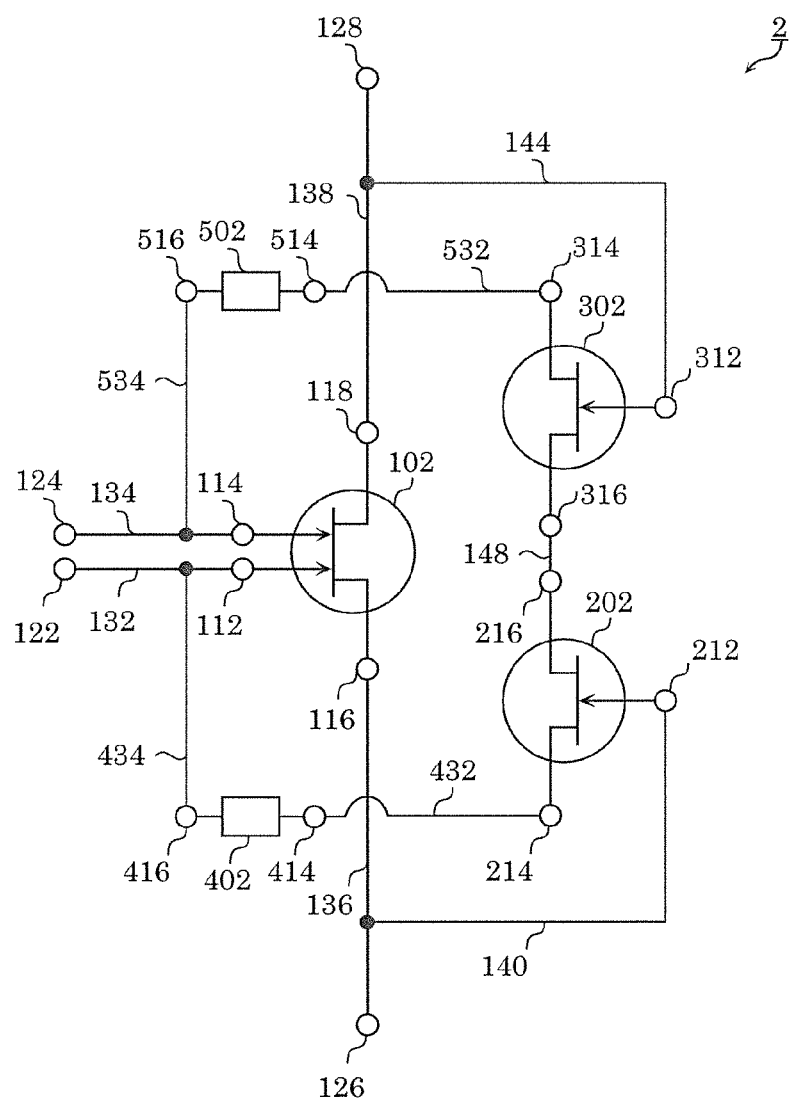
FIG. 3 is an equivalent circuit diagram illustrating a semiconductor device according to Embodiment 2.
Figure 4:
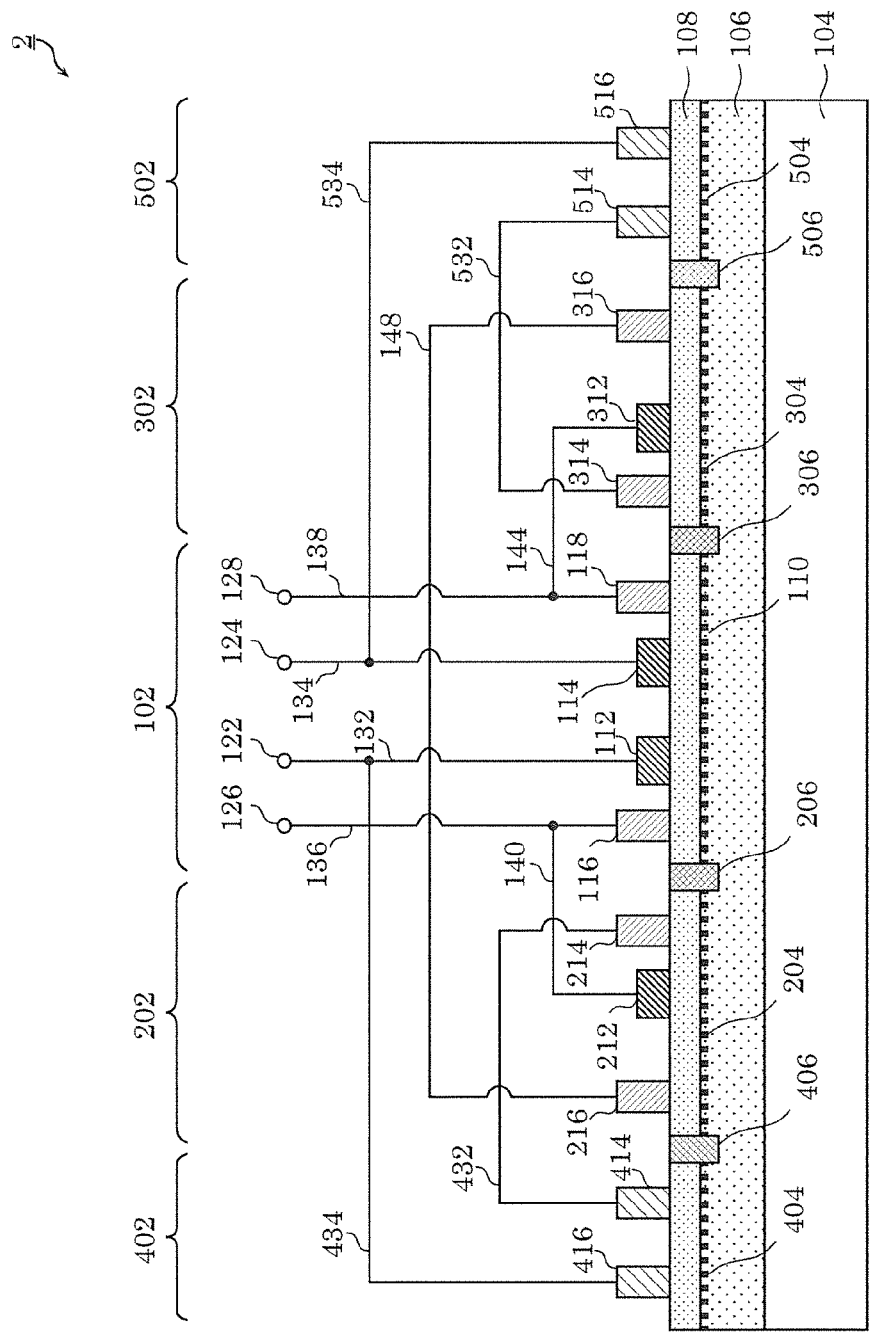
FIG. 4 is a cross-sectional view illustrating a semiconductor device according to Embodiment 2.

In FIG. 3 and FIG. 4, structural elements that are the same as those in FIG. 1 and FIG. 2 are assigned the same reference signs, and description thereof will be omitted. As illustrated in FIG. 3, in addition to the elements in Embodiment 1, first voltage drop element 402 which is a high resistance element is provided in the electric current path from third electrode 214 to first gate electrode 112, and second voltage drop element 502 which is a high resistance element is provided in the electric current path from fifth electrode 314 to second gate electrode 114. The other elements are the same as or similar to those in Embodiment 1.

As illustrated in FIG. 4, electrode 414 and electrode 416 are formed on channel layer 106 with barrier layer 108 and form first voltage drop element 402 in which the electric current flows through fourth channel region 404. Likewise, electrode 514 and electrode 516 are formed on channel layer 106 with barrier layer 108 and form second voltage drop element 502 in which the electric current flows through fifth channel region 504. As with first channel region 110, second channel region 204, and third channel region 304, fourth channel region 404 is formed by a highly concentrated two-dimensional electron gas generated at the junction interface between channel layer 106 and barrier layer 108. Furthermore, fourth channel region 404 is separated from first channel region 110, second channel region 204, and third channel region 304 by providing third element isolation region 406. Likewise, fifth channel region 504 is separated from first channel region 110, second channel region 204, third channel region 304, and fourth channel region 404 by providing fourth element isolation region 506. Third element isolation region 406 and fourth element isolation region 506 may be formed by implanting boron ions, iron ions, or other ions in channel layer 106 and barrier layer 108.

First voltage drop element 402 is inserted into the electric current path from third electrode 214 to first gate electrode 112 in Embodiment 1. Examples of a connection method includes connecting electrode 414 and electrode 416 to third electrode 214 and first gate electrode 112 via line 432 and line 434, respectively. It is sufficient that at least one of electrode 414 and electrode 416 be connected to fourth channel region 404 in a high resistance state. For example, at least one of electrode 414 and electrode 416 may be made of one kind of metal selected from Ti, Al, Mo, Hf, and the like or have a layered structure including a combination of two or more of these kinds of metal on an insulator such as silicon nitride or silicon oxide formed on the channel layer 106 side. Among electrode 414 and electrode 416, an electrode that is not connected to fourth channel region 404 in the high resistance state may, for example, be made of one kind of metal selected from Ti, Al, Mo, Hf, and the like or have a layered structure including a combination of two or more of these kinds of metal.

Second voltage drop element 502 is inserted into the electric current path from fifth electrode 314 to second gate electrode 114 in Embodiment 1. The connection method uses line 532 and line 534, similar to that for first voltage drop element 402. The material and position may be the same as or similar to those of first voltage drop element 402.

In Embodiment 1, as a result of adding first field-effect transistor 202 and second field-effect transistor 302 to first bidirectional switch element 102, there is an electric current path from first electrode 116 toward first gate electrode 112 via third gate electrode 212 and third electrode 214; likewise, there is an electric current path from second electrode 118 toward second gate electrode 114 via fourth gate electrode 312 and fifth electrode 314. These electric current paths serve as electric current paths for passing the surge current, but simultaneously become a path for the leakage current flowing from first electrode 116 to first gate electrode 112 and a path for the leakage current flowing from second electrode 118 to second gate electrode 114. Therefore, a driving operation of applying a negative voltage to first gate electrode 112 and second gate electrode 114 cannot be performed.

In this regard, in the present embodiment, first voltage drop element 402 and second voltage drop element 502 each of which is a high resistance element are provided. Therefore, it is possible to reduce the leakage current flowing from first electrode 116 to first gate electrode 112 and the leakage current flowing from second electrode 118 to second gate electrode 114.

This makes it possible to adapt to the driving operation of applying a negative voltage to first gate electrode 112 and second gate electrode 114 of first bidirectional switch element 102 with a reduced leakage current flowing from first electrode 116 toward first gate electrode 112 and a reduced leakage current flowing from second electrode 118 toward second gate electrode 114 while improving the resistance to surges. This means that first field-effect transistor 202 and second field-effect transistor 302 which serve as protection elements will not disturb the normal operation of first bidirectional switch element 102 that is driven at a negative voltage.

Furthermore, instead of inserting single first voltage drop element 402 and single second voltage drop element 502, it is also possible to insert two or more serially-connected first voltage drop elements 402 and second voltage drop elements 502. This improves the effectiveness of reducing the leakage current flowing from first electrode 116 toward first gate electrode 112 and the effectiveness of reducing the leakage current flowing from second electrode 118 toward second gate electrode 114, making it possible to adapt to a driving operation of applying a greater negative voltage to first gate electrode 112 and second gate electrode 114.

Furthermore, first voltage drop element 402 and second voltage drop element 502 are high resistance elements, but may be any elements that can prevent an electric current from flowing from first electrode 116 toward first gate electrode 112 and an electric current from flowing from second electrode 118 toward second gate electrode 114, specific examples of which include a diode and an inductor.

Furthermore, the process of fabricating an electrode in first voltage drop element 402 and second voltage drop element 502 may be the same as that in first bidirectional switch element 102. With this, the manufacturing process can be simplified.

Furthermore, first voltage drop element 402 and second voltage drop element 502 may be smaller in element size than first bidirectional switch element 102. This makes it possible to reduce the increase in parasitic capacitance of first bidirectional switch element 102 that is due to added first voltage drop element 402 and second voltage drop element 502. Specifically, the element size of first voltage drop element 402 and second voltage drop element 502 is preferably about one hundredth of the element size of first bidirectional switch element 102.

Furthermore, channel layer 106 and barrier layer 108 in first voltage drop element 402 and second voltage drop element 502 may be made of a material different from that of channel layer 106 and barrier layer 108 in first bidirectional switch element 102, first field-effect transistor 202, and second field-effect transistor 302. In other words, each of first voltage drop element 402 and second voltage drop element 502 may be made of a material different from that of first bidirectional switch element 102, first field-effect transistor 202, and second field-effect transistor 302 while sharing substrate 104.

Furthermore, substrate 104 in first voltage drop element 402 and second voltage drop element 502 may be made of a material different from that of substrate 104 in first bidirectional switch element 102, first field-effect transistor 202, and second field-effect transistor 302. In other words, first voltage drop element 402 and second voltage drop element 502 may be formed by a different manufacturing process using a different substrate from first bidirectional switch element 102, first field-effect transistor 202, and second field-effect transistor 302, and may be connected by a wire or the like.

Variation of Embodiment 2

Figure 5:
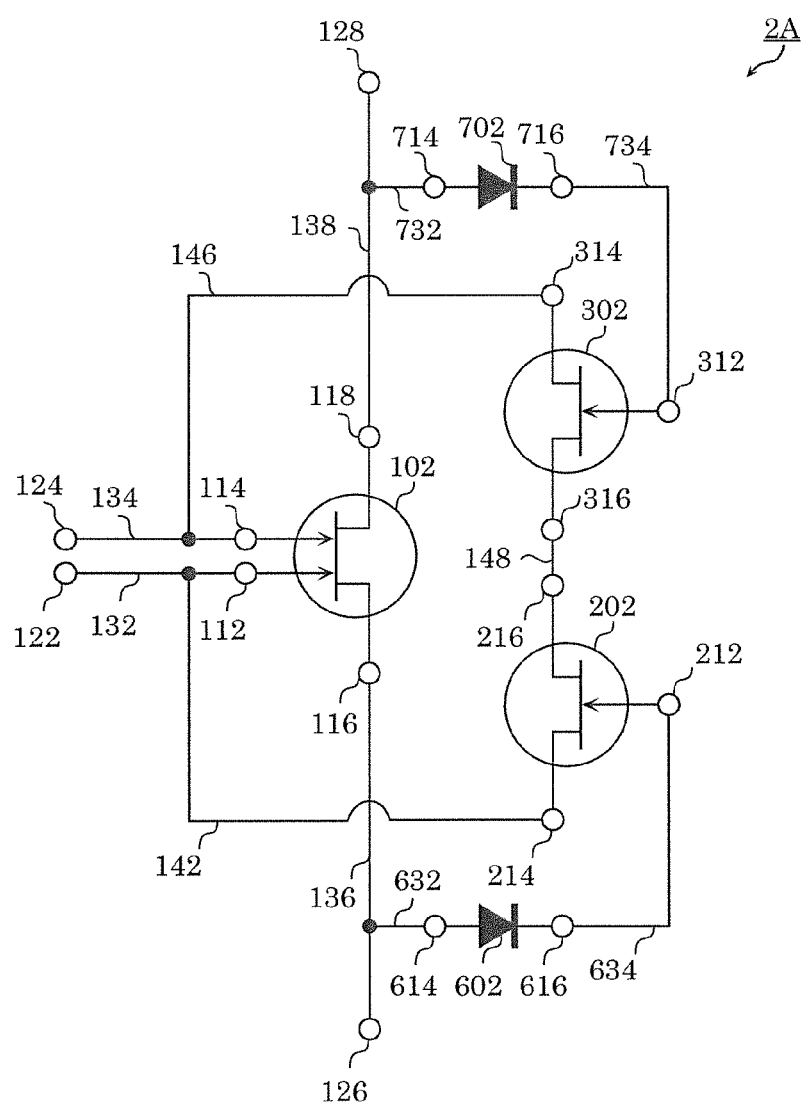
FIG. 5 is an equivalent circuit diagram illustrating a semiconductor device according to a variation of Embodiment 2.
Figure 6:
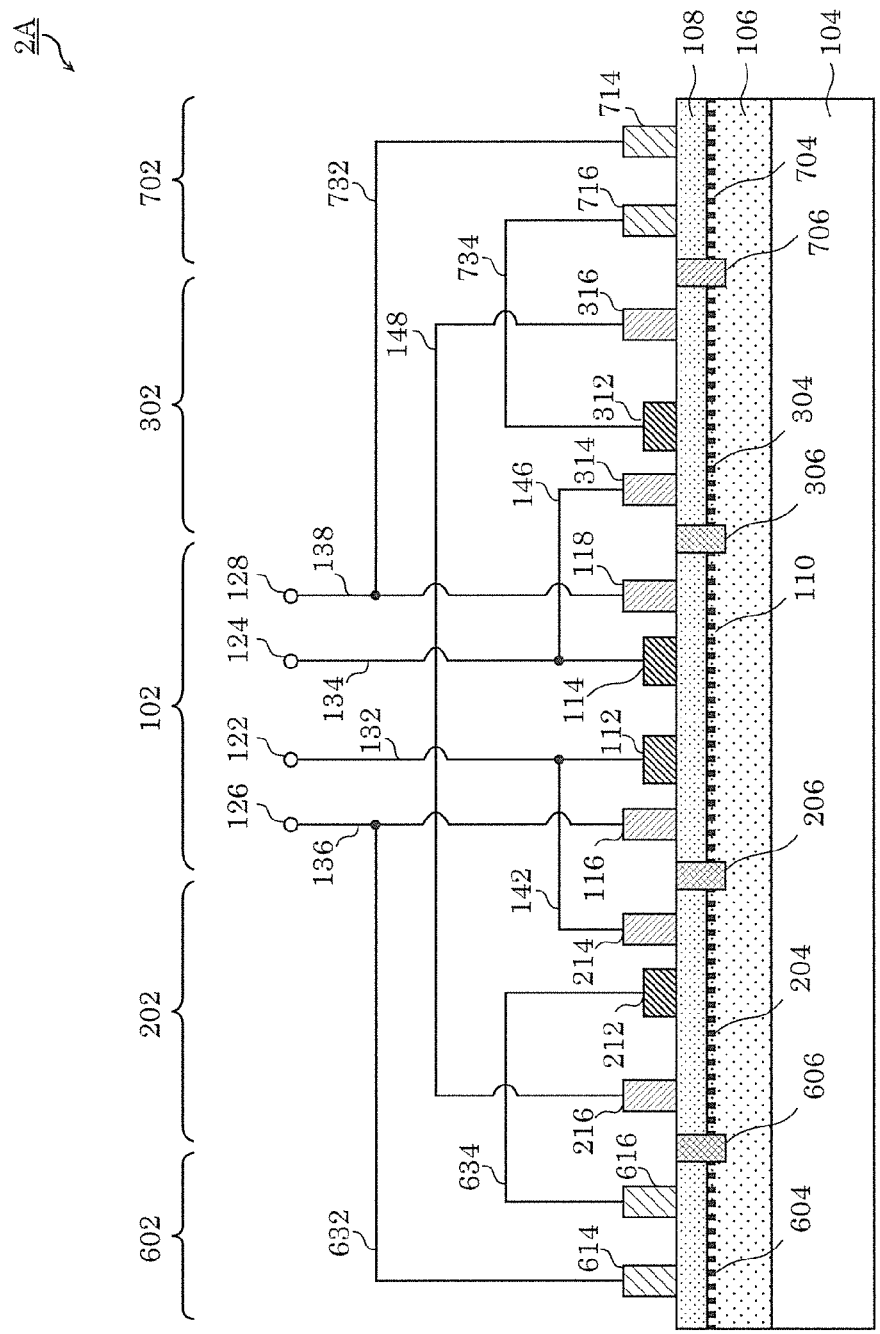
FIG. 6 is a cross-sectional view illustrating a semiconductor device according to a variation of Embodiment 2.

Semiconductor device 2A according to a variation of Embodiment 2 will be described below with reference to the drawings. In FIG. 5 and FIG. 6, structural elements that are the same as those in FIG. 1 and FIG. 2 are assigned the same reference signs, and description thereof will be omitted.

In the present variation, third voltage drop element 602 which is a diode is provided in the electric current path from first electrode 116 to third gate electrode 212, and fourth voltage drop element 702 which is a diode is provided in the electric current path from second electrode 118 to fourth gate electrode 312.

As illustrated in FIG. 6, first anode electrode 614 and first cathode electrode 616 are formed on channel layer 106 with barrier layer 108 and form third voltage drop element 602. Likewise, second anode electrode 714 and second cathode electrode 716 are formed on channel layer 106 with barrier layer 108 and form fourth voltage drop element 702. As with first channel region 110, second channel region 204, and third channel region 304, sixth channel region 604 and seventh channel region 704 are formed by a highly concentrated two-dimensional electron gas generated at the junction interface between channel layer 106 and barrier layer 108. Furthermore, sixth channel region 604 is separated from first channel region 110, second channel region 204, and third channel region 304 by providing fifth element isolation region 606. Likewise, seventh channel region 704 is separated from first channel region 110, second channel region 204, third channel region 304, and sixth channel region 604 by providing sixth element isolation region 706. Fifth element isolation region 606 and sixth element isolation region 706 may be formed by implanting boron ions, iron ions, or other ions in channel layer 106 and barrier layer 108.

The electric current at third voltage drop element 602 flows from first anode electrode 614 to first cathode electrode 616 via sixth channel region 604. Third voltage drop element 602 is inserted into the electric current path from first electrode 116 to third gate electrode 212 in Embodiment 1. Examples of a connection method includes connecting first anode electrode 614 and first cathode electrode 616 to first electrode 116 and third gate electrode 212 via line 632 and line 634, respectively.

The position of fourth voltage drop element 702 and the electric current path therefor are set with line 732 and line 734, similar to the case of third voltage drop element 602.

It is sufficient that first cathode electrode 616 and second cathode electrode 716 be in ohmic contact with sixth channel region 604 and seventh channel region 704; a recess may be provided.

Furthermore, first anode electrode 614 and second anode electrode 714 are made of a material that forms a depletion layer extending from first anode electrode 614 and second anode electrode 714 toward substrate 104 in barrier layer 108 and channel layer 106. In addition, first anode electrode 614 and second anode electrode 714 are made of a material having a function for passing an electric current from first anode electrode 614 and second anode electrode 714 toward sixth channel region 604 and seventh channel region 704.

First cathode electrode 616 and second cathode electrode 716 may, for example, be made of one kind of metal selected from Ti, Al, Mo, Hf, and the like or have a layered structure including a combination of two or more of these kinds of metal.

First anode electrode 614 and second anode electrode 714 may, for example, be made of one kind of metal selected from Ti, Al, Ni, Pt, Pd, Au, Mo, Hf, and the like or have a layered structure including a combination of two or more of these kinds of metal, or may be made of one kind of metal selected from Ti, Al, Ni, Pt, Pd, Au, Mo, Hf, and the like or have a layered structure including a combination of two or more of these kinds of metal on a p-type semiconductor formed on the channel layer 106 side. In the present variation, in the case of using the layered structure of the p-type semiconductor and the metal for first anode electrode 614 and second anode electrode 714, the p-type semiconductor includes, for example, magnesium (Mg)-doped p-type $In_kAl_lGa_{1-(k+l)}N$ ($0 \leq k \leq 1$, $0 \leq l \leq 1$, and $k+l \leq 1$), and preferably includes p-type GaN (that is, $k=l=0$).

In Embodiment 2, first voltage drop element 402 is provided in the electric current path from third electrode 214 to first gate electrode 112, and second voltage drop element 502 is provided in the electric current path from fifth electrode 314 to second gate electrode 114. This makes it possible to adapt to the driving operation of applying a negative voltage to first gate electrode 112 and second gate electrode 114 of first bidirectional switch element 102 with a reduced leakage current flowing from first electrode 116 toward first gate electrode 112 and a reduced leakage current flowing from second electrode 118 toward second gate electrode 114. However, when first voltage drop element 402 and second voltage drop element 502 are inserted in order to adapt to the driving operation of applying a negative voltage, there is a possibility that the surge current may not be able to sufficiently flow between first gate electrode 112 and second gate electrode 114 of first bidirectional switch element 102, and thus the resistance to surges may be reduced.

In this regard, in the present variation, third voltage drop element 602 is provided in the electric current path from first electrode 116 to third gate electrode 212, and fourth voltage drop element 702 is provided in the electric current path from second electrode 118 to fourth gate electrode 312. Therefore, it is possible to reduce the leakage current flowing from first electrode 116 toward first gate electrode 112 via third gate electrode 212 and third electrode 214. Likewise, it is possible to reduce the leakage current flowing from second electrode 118 toward second gate electrode 114 via fourth gate electrode 312 and fifth electrode 314. In addition, third voltage drop element 602 and fourth voltage drop element 702 are not inserted into the electric current path between first gate electrode 112 and second gate electrode 114. Therefore, the improved resistance to surges between first gate electrode 112 and second gate electrode 114 resulting from insertion of first field-effect transistor 202 and second field-effect transistor 302 will not be reduced. Therefore, it is possible to adapt to the driving operation of applying a negative voltage to first gate electrode 112 and second gate electrode 114 of first bidirectional switch element 102 while maintaining improvement of the resistance to surges.

In the present variation, instead of inserting single third voltage drop element 602 and single fourth voltage drop element 702, it is also possible to insert two or more serially-connected third voltage drop elements 602 and fourth voltage drop elements 702. This improves the effectiveness of reducing the leakage current flowing from first electrode 116 toward first gate electrode 112 and the effectiveness of reducing the leakage current flowing from second electrode 118 toward second gate electrode 114. Thus, it is possible to adapt to a driving operation of applying a greater negative voltage to first gate electrode 112 and second gate electrode 114 of first bidirectional switch element 102.

Furthermore, in the present variation, first voltage drop element 402 may be provided in the electric current path from third electrode 214 to first gate electrode 112, and second voltage drop element 502 may be provided in the electric current path from fifth electrode 314 to second gate electrode 114, as in Embodiment 2. This improves the effectiveness of reducing the leakage current flowing from first electrode 116 toward first gate electrode 112 and the effectiveness of reducing the leakage current flowing from second electrode 118 toward second gate electrode 114.

Thus, it is possible to adapt to a driving operation of applying a greater negative voltage to first gate electrode 112 and second gate electrode 114 of first bidirectional switch element 102.

Furthermore, third voltage drop element 602 and fourth voltage drop element 702 may each be a diode having a transistor structure. Specifically, first anode electrode 614 may have a structure obtained by creating a short circuit between the gate electrode and the source electrode of third voltage drop element 602 having the transistor structure, and first cathode electrode 616 may be the drain electrode of third voltage drop element 602 having the transistor structure. Likewise, second anode electrode 714 may have a structure obtained by creating a short circuit between the gate electrode and the source electrode of fourth voltage drop element 702 having the transistor structure, and second cathode electrode 716 may be the drain electrode of fourth voltage drop element 702 having the transistor structure.

Furthermore, in the present variation, third voltage drop element 602 and fourth voltage drop element 702 are diodes, but may be any elements that can prevent an electric current from flowing from first electrode 116 toward first gate electrode 112 and an electric current from flowing from second electrode 118 toward second gate electrode 114. Specifically, bidirectional diodes, high resistance elements, or inductors may be used.

Furthermore, in the variation, the process of fabricating an electrode in third voltage drop element 602 and fourth voltage drop element 702 may be the same as the process of fabricating an electrode in first bidirectional switch element 102. With this, the manufacturing process can be simplified.

Furthermore, third voltage drop element 602 and fourth voltage drop element 702 may be smaller in element size than first bidirectional switch element 102. This makes it possible to reduce the increase in parasitic capacitance of first bidirectional switch element 102 that is due to added third voltage drop element 602 and fourth voltage drop element 702. Specifically, the element size of third voltage drop element 602 and fourth voltage drop element 702 is preferably about one hundredth of the element size of first bidirectional switch element 102.

Furthermore, channel layer 106 and barrier layer 108 in third voltage drop element 602 and fourth voltage drop element 702 may be made of a material different from that of channel layer 106 and barrier layer 108 in first bidirectional switch element 102, first field-effect transistor 202, and second field-effect transistor 302.

Furthermore, substrate 104 in third voltage drop element 602 and fourth voltage drop element 702 may be made of a material different from that of substrate 104 in first bidirectional switch element 102, first field-effect transistor 202, and second field-effect transistor 302.

Embodiment 3

Semiconductor device 3 according to Embodiment 3 will be described below with reference to the drawings.

Figure 7:
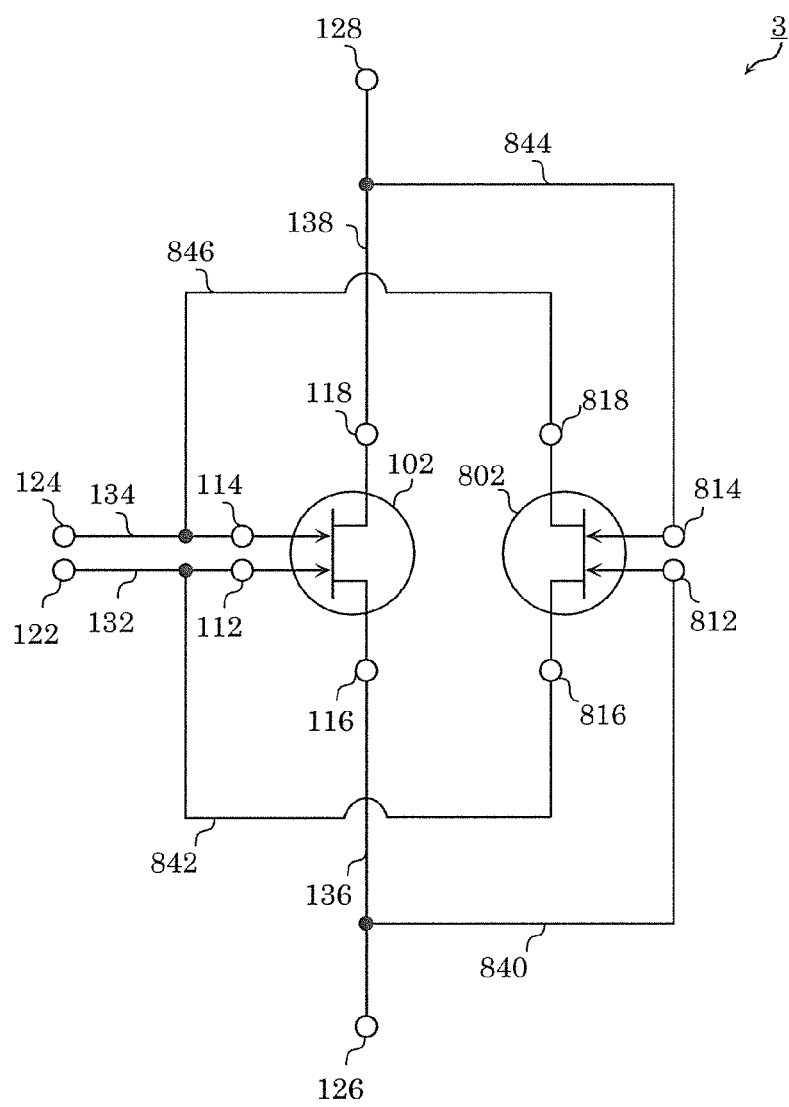
FIG. 7 is an equivalent circuit diagram illustrating a semiconductor device according to Embodiment 3.
Figure 8:
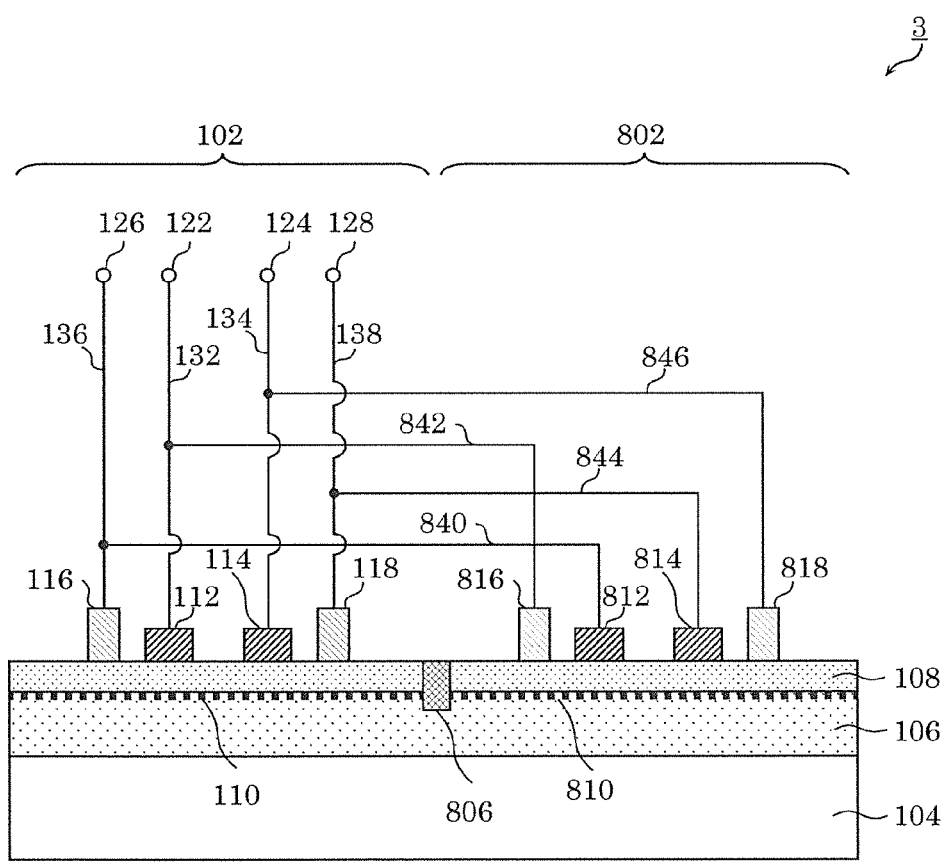
FIG. 8 is a cross-sectional view illustrating a semiconductor device according to Embodiment 3.

In FIG. 7 and FIG. 8, structural elements that are the same as those in FIG. 1 and FIG. 2 are assigned the same reference signs, and description thereof will be omitted. As illustrated in FIG. 7 and FIG. 8, semiconductor device 3 according to the present embodiment includes first bidirectional switch element 102 and second bidirectional switch element 802.

First bidirectional switch element 102 illustrated in FIG. 7 and FIG. 8 controls conduction between first electrode 116 and second electrode 118 by first gate electrode 112 and second gate electrode 114. Second bidirectional switch element 802 is a protection element which protects first bidirectional switch element 102.

In the present embodiment, as illustrated in FIG. 8, seventh electrode 816 (seventh ohmic electrode), eighth electrode 818 (eighth ohmic electrode), fifth gate electrode 812, which is positioned between seventh electrode 816 and eighth electrode 818, and sixth gate electrode 814, which is positioned between fifth gate electrode 812 and eighth electrode 818, are formed on channel layer 106 with barrier layer 108 (fourth compound semiconductor layer of n-type conductivity); thus, second bidirectional switch element 802 is formed. As with first channel region 110, eighth channel region 810 is formed by a highly concentrated two-dimensional electron gas generated at the junction interface between channel layer 106 and barrier layer 108. Furthermore, eighth channel region 810 is separated from first channel region 110 by providing seventh element isolation region 806. Seventh element isolation region 806 may be formed by implanting boron ions, iron ions, or other ions in channel layer 106 and barrier layer 108.

As a method of connecting first bidirectional switch element 102 and second bidirectional switch element 802, first, first electrode 116 is connected to fifth gate electrode 812 via line 840. First gate electrode 112 is connected to seventh electrode 816 via line 842. Second electrode 118 is connected to sixth gate electrode 814 via line 844. Second gate electrode 114 is electrically connected to eighth electrode 818 via line 846.

It is sufficient that seventh electrode 816 and eighth electrode 818 be in ohmic contact with first channel region 110; a recess may be provided. Specifically, seventh electrode 816 and eighth electrode 818 may, for example, be made of one kind of metal selected from Ti, Al, Mo, Hf, and the like or have a layered structure including a combination of two or more of these kinds of metal.

Here, assume that the maximum applicable voltage between one of first electrode 116 and first gate electrode 112 and one of second electrode 118 and second gate electrode 114 in first bidirectional switch element 102 illustrated in FIG. 7 and FIG. 8 is denoted as Vmax, and the withstand voltage between one of seventh electrode 816 and fifth gate electrode 812 and one of eighth electrode 818 and sixth gate electrode 814 in second bidirectional switch element 802 is denoted as Vb3. In this case, first bidirectional switch element 102 and second bidirectional switch element 802 are designed so as to satisfy the following expression.

$$V\text{max} < Vb3 \qquad \text{(Expression 2)}$$

With such designs, second bidirectional switch element 802 has no impact on normal switching operations of first bidirectional switch element 102. Note that the maximum applicable voltage Vmax herein for first bidirectional switch element 102 is the highest possible voltage that can be applied to the element during the normal switching operation and has a lower value than the withstand voltage of the element.

In particular, the element including GaN has a low avalanche resistance; therefore, first bidirectional switch element 102 is designed to have a withstand voltage of approximately 1,000 V when the maximum applicable voltage Vmax for first bidirectional switch element 102 is 600 V, for example. In this case, Vb3 needs to be designed to have, for example, a value of at least 600 V. In order to reduce the unnecessary leakage current flowing through the protection element, Vb3 is more preferably designed to have a value equivalent to no less than 1,000 V, which is the withstand voltage of first bidirectional switch element 102.

As a more specific element design, the distance between fifth gate electrode 812 and sixth gate electrode 814 in second bidirectional switch element 802 is preferably set greater than or equal to the distance between the distance between first gate electrode 112 and second gate electrode 114 in first bidirectional switch element 102. This is because the withstand voltage is approximately proportional to the distance between the gate and the drain of the field-effect transistor including GaN.

In the present embodiment, one element, that is, second bidirectional switch element 802, produces the effect of improving the resistance to surges, which is obtained by introducing two elements, i.e., first field-effect transistor 202 and second field-effect transistor 302, as in Embodiment 1.

Described more specifically, consider the case where between first gate electrode 112 and second gate electrode 114 of first bidirectional switch element 102, a surge that is positive with respect to second gate electrode 114 is applied to first gate electrode 112 through first external gate terminal 122 and second external gate terminal 124. Capacitive coupling to seventh electrode 816 connected to first gate electrode 112 causes an increase in the potential at fifth gate electrode 812 and sixth gate electrode 814 each of which is being a floating electrode, and thus second bidirectional switch element 802 is turned ON. This allows the positive surge current applied to first gate electrode 112 to flow to second gate electrode 114 through seventh electrode 816 and eighth electrode 818.

Conversely, when a surge that is positive with respect to first gate electrode 112 is applied to second gate electrode 114 through first external gate terminal 122 and second external gate terminal 124, the surge current can flow to first gate electrode 112.

Thus, the positive and negative surge voltages generated between first gate electrode 112 and second gate electrode 114 can be reduced by merely introducing one element, that is, second bidirectional switch element 802.

Note that fifth gate electrode 812 is preferably made of a material having a function for passing an electric current from fifth gate electrode 812 toward eighth channel region 810.

With this, it is possible to improve the resistance to a surge causing a positive bias to be applied to first electrode 116 between first gate electrode 112 and first electrode 116, and it is possible to improve the resistance to a surge causing a positive bias to be applied to first electrode 116 between second gate electrode 114 and first electrode 116.

First, consider the case where between first gate electrode 112 and first electrode 116 of first bidirectional switch element 102, a positive surge is applied to first electrode 116 through first external gate terminal 122 and first external terminal 126. At this time, since second bidirectional switch element 802 has a function for passing an electric current from fifth gate electrode 812 toward eighth channel region 810, the positive surge applied to first electrode 116 can result in a surge current flowing from fifth gate electrode 812 to first gate electrode 112 through seventh electrode 816. Thus, it is possible to improve the resistance to a surge causing a positive bias to be applied to first electrode 116 between first gate electrode 112 and first electrode 116.

Subsequently, consider the case where between second gate electrode 114 and first electrode 116 of first bidirectional switch element 102, a positive surge is applied to first electrode 116 through second external gate terminal 124 and first external terminal 126. At this time, second bidirectional switch element 802 has a function for passing an electric current from fifth gate electrode 812 toward eighth channel region 810, and sixth gate electrode 814 becomes a floating electrode. Therefore, the positive surge applied to first electrode 116 can result in a surge current flowing from fifth gate electrode 812 to second gate electrode 114 via eighth electrode 818. Thus, it is possible to improve the resistance to a surge causing a positive bias to be applied to first electrode 116 between second gate electrode 114 and first electrode 116.

Fifth gate electrode 812 may, for example, be made of one kind of metal selected from Ti, Al, Ni, Pt, Pd, Au, Mo, Hf, and the like or have a layered structure including a combination of two or more of these kinds of metal, or may be made of one kind of metal selected from Ti, Al, Ni, Pt, Pd, Au, Mo, Hf, and the like or have a layered structure including a combination of two or more of these kinds of metal on a p-type semiconductor formed on the channel layer 106 side. In the present embodiment, in the case of using the layered structure of the p-type semiconductor and the metal for fifth gate electrode 812, the p-type semiconductor includes, for example, magnesium (Mg)-doped p-type $In_mAl_nGa_{1-(m+n)}N$ ($0 \leq m \leq 1$, $0 \leq n \leq 1$, and $m+n \leq 1$), and preferably includes p-type GaN (that is, m=n=0).

Note that sixth gate electrode 814 is preferably made of a material having a function for passing an electric current from sixth gate electrode 814 toward eighth channel region 810.

With this, it is possible to improve the resistance to a surge causing a positive bias to be applied to second electrode 118 between second gate electrode 114 and second electrode 118, and it is possible to improve the resistance to a surge causing a positive bias to be applied to second electrode 118 between first gate electrode 112 and second electrode 118.

Furthermore, the resistance to surges can likewise be improved also in the case where between second gate electrode 114 and second electrode 118 of first bidirectional switch element 102, a positive surge is applied to second electrode 118 through second external gate terminal 124 and second external terminal 128 and in the case where between first gate electrode 112 and second electrode 118 of first bidirectional switch element 102, a positive surge is applied to second electrode 118 through first external gate terminal 122 and second external terminal 128.

Sixth gate electrode 814 preferably has the same as or similar material, configuration, etc., as fifth gate electrode 812 described above.

Note that second bidirectional switch element 802 is preferably a normally-off bidirectional switch element. Specifically, fifth gate electrode 812 and sixth gate electrode 814 are made of a material that forms a depletion layer extending from fifth gate electrode 812 and sixth gate electrode 814 toward substrate 104 in barrier layer 108 and channel layer 106. With this, when the voltage between first electrode 116 and first gate electrode 112 and the voltage between second electrode 118 and second gate electrode 114 are 0 V, the voltage between fifth gate electrode 812 and seventh electrode 816 and the voltage between sixth gate electrode 814 and eighth electrode 818 are also 0 V. Thus, second bidirectional switch element 802 is in OFF state, having no adverse effect on operations of first bidirectional switch element 102.

Furthermore, the process of fabricating an electrode in second bidirectional switch element 802 may be the same as the process of fabricating an electrode in first bidirectional switch element 102. With this, the manufacturing process can be simplified.

Furthermore, second bidirectional switch element 802 may be smaller in element size than first bidirectional switch element 102. This makes it possible to reduce the increase in parasitic capacitance of first bidirectional switch element 102 that is due to added second bidirectional switch element 802. Specifically, the element size of second bidirectional switch element 802 is preferably about one hundredth of the element size of first bidirectional switch element 102.

Furthermore, channel layer 106 and barrier layer 108 in second bidirectional switch element 802 may be made of a material different from that of channel layer 106 and barrier layer 108 in first bidirectional switch element 102.

Furthermore, substrate 104 (second substrate) in second bidirectional switch element 802 may be different from substrate 104 (first substrate) in first bidirectional switch element 102; these elements may be fabricated in different manufacturing processes using separate substrates.

Embodiment 4

Figure 9:
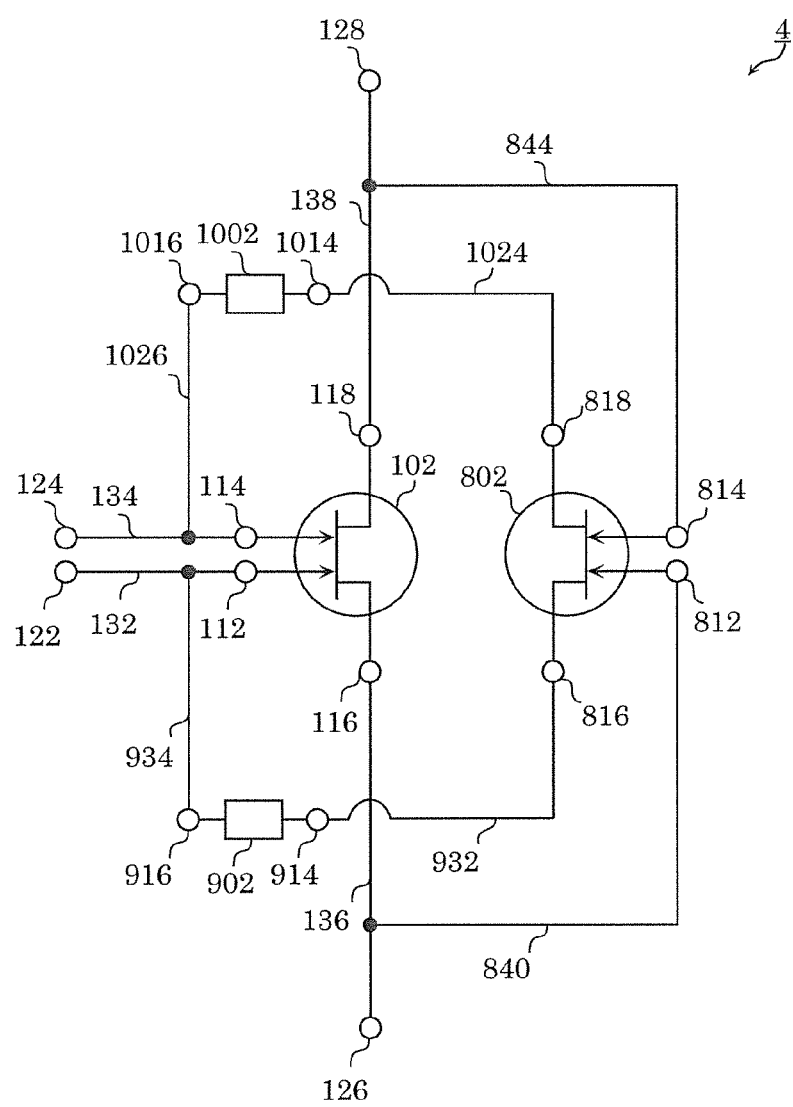
FIG. 9 is an equivalent circuit diagram illustrating a semiconductor device according to Embodiment 4.
Figure 10:
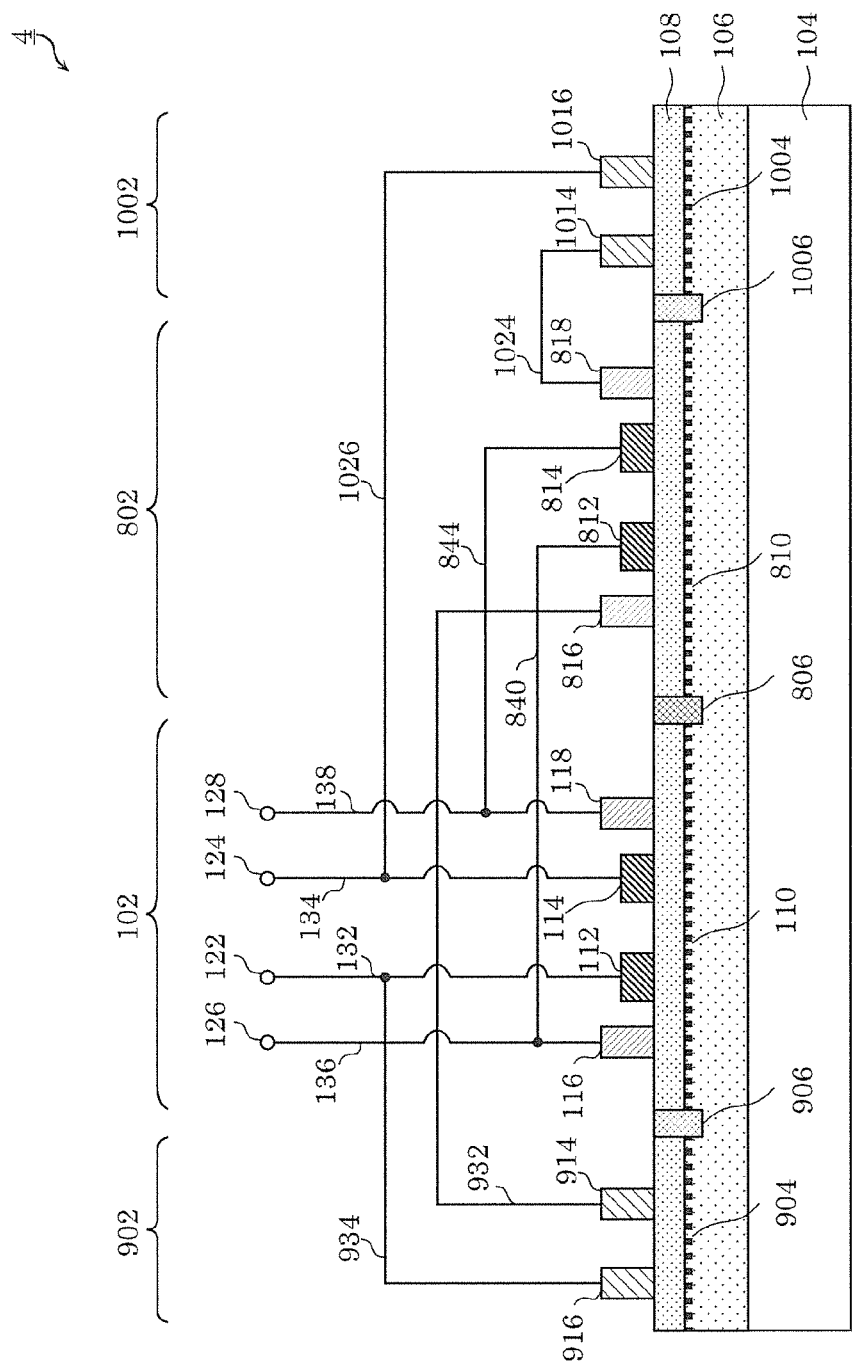
FIG. 10 is a cross-sectional view illustrating a semiconductor device according to Embodiment 4.

Semiconductor device 4 according to Embodiment 4 will be described below with reference to the drawings. In FIG. 9 and FIG. 10, structural elements that are the same as those in FIG. 7 and FIG. 8 are assigned the same reference signs, and description thereof will be omitted.

In the present embodiment, as illustrated in FIG. 9, in addition to the elements in Embodiment 3, fifth voltage drop element 902 which is a high resistance element is provided in the electric current path from seventh electrode 816 to first gate electrode 112, and sixth voltage drop element 1002 which is a high resistance element is provided in the electric current path from eighth electrode 818 to second gate electrode 114. The other elements are the same as or similar to those in Embodiment 3.

The formation method and the role of fifth voltage drop element 902 and sixth voltage drop element 1002 are the same as or similar to those of first voltage drop element 402 and second voltage drop element 502 according to Embodiment 2, and electrodes 914 and 916, electrodes 1014 and 1016, lines 932 and 934, and lines 1024 and 1026 are used. Furthermore, ninth channel region 904, tenth channel region 1004, eighth element isolation region 906, and ninth element isolation region 1006 are used.

Variation of Embodiment 4

Figure 11:
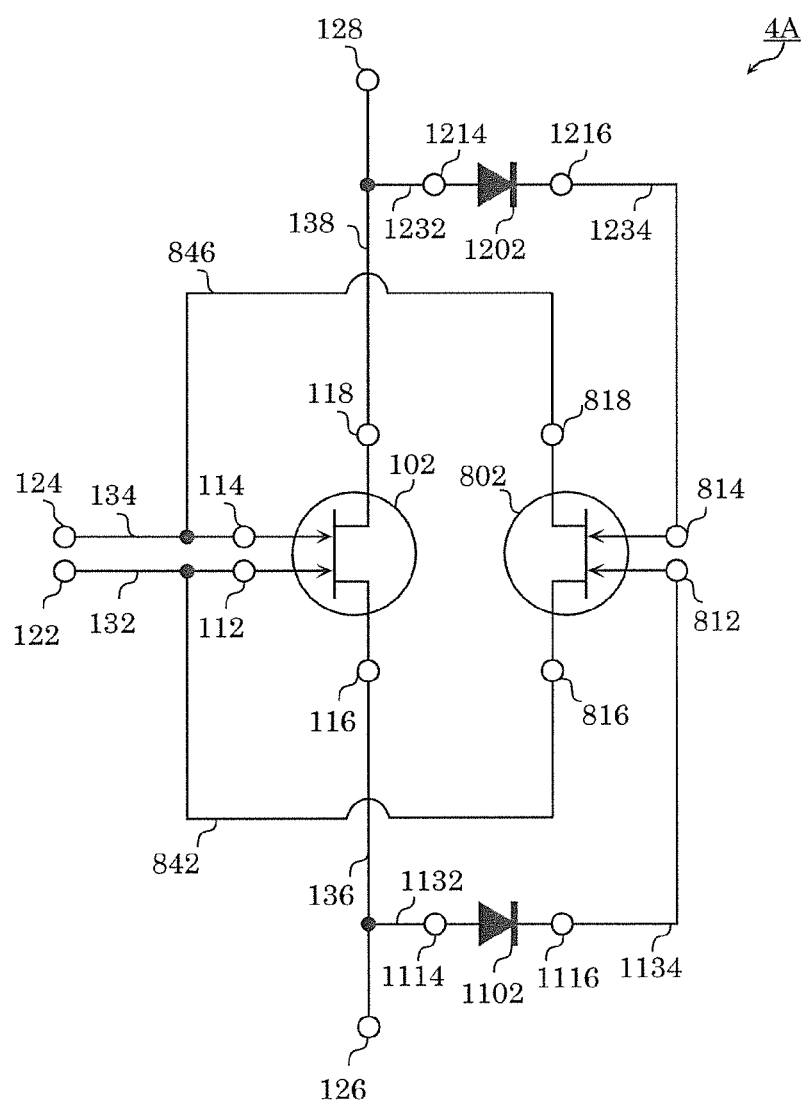
FIG. 11 is an equivalent circuit diagram illustrating a semiconductor device according to a variation of Embodiment 4.
Figure 12:
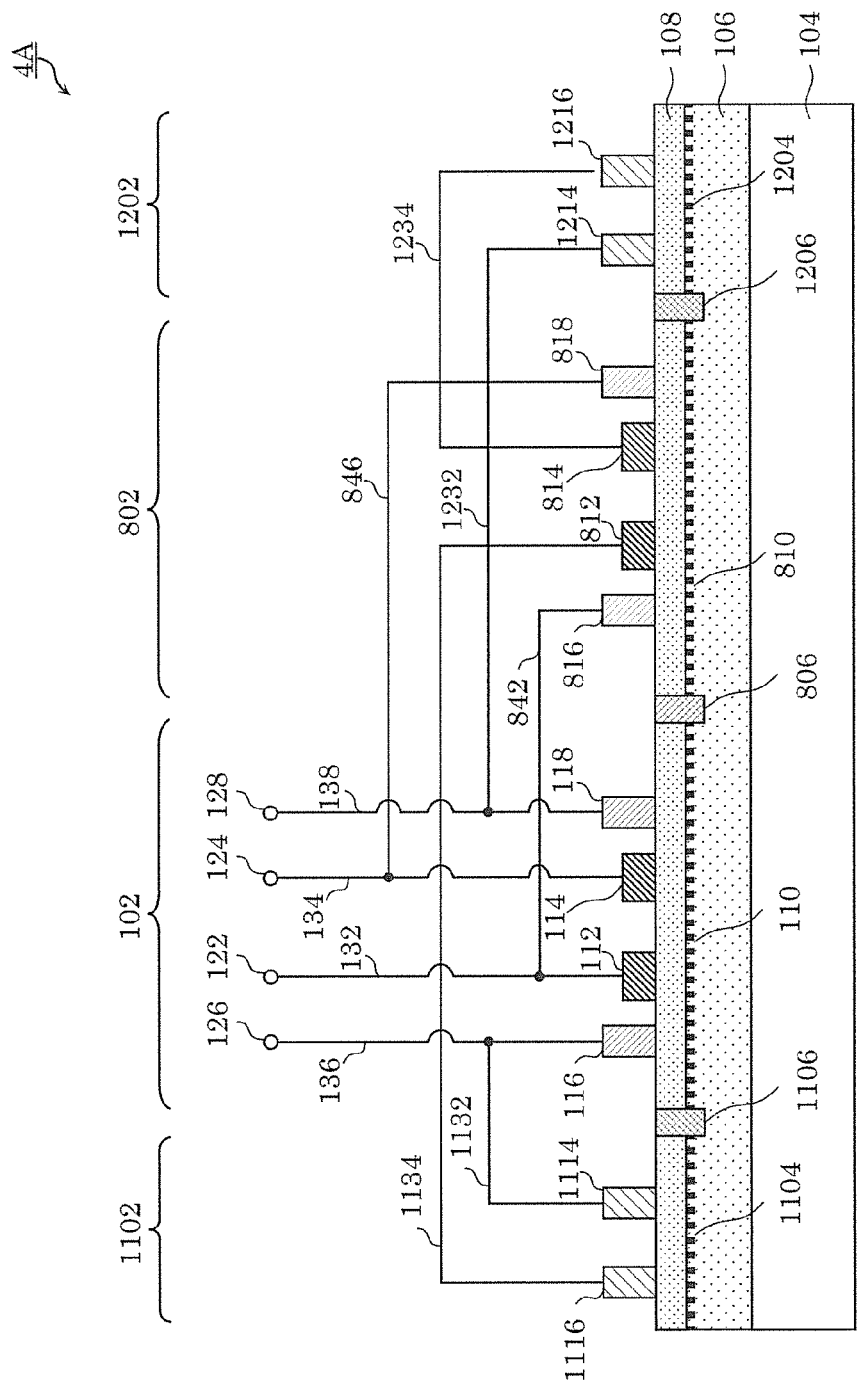
FIG. 12 is a cross-sectional view illustrating a semiconductor device according to a variation of Embodiment 4.

Semiconductor device 4A according to a variation of Embodiment 4 will be described below with reference to the drawings. In FIG. 11 and FIG. 12, structural elements that are the same as those in FIG. 7 and FIG. 8 are assigned the same reference signs, and description thereof will be omitted.

In the present variation, seventh voltage drop element 1102 which is a diode is provided in the electric current path from first electrode 116 to fifth gate electrode 812, and eighth voltage drop element 1202 which is a diode is provided in the electric current path from second electrode 118 to sixth gate electrode 814.

The formation method and the role of seventh voltage drop element 1102 and eighth voltage drop element 1202 are the same as or similar to those of third voltage drop element 602 and fourth voltage drop element 702 according to the variation of Embodiment 2, and third anode electrode 1114 and third cathode electrode 1116, fourth anode electrode 1214 and fourth cathode electrode 1216, lines 1132 and 1134, and lines 1232 and 1234 are used. Furthermore, eleventh channel region 1104, eleventh channel region 1204, tenth element isolation region 1106, and eleventh element isolation region 1206 are used.

Other Embodiments

Although the semiconductor devices according to the present disclosure have been described thus far based on the above embodiments and variations thereof, the semiconductor devices according to the present disclosure are not limited to the embodiments and variations thereof described above. The present disclosure includes other embodiments implemented through a combination of arbitrary structural elements of the above embodiments and variations thereof, or variations obtained through the application of various modifications to the above embodiments and variations thereof that may be conceived by a person having ordinary skill in the art, without departing from the essence of the present disclosure, and various devices in which the semiconductor device according to the present disclosure is built-in.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The semiconductor device according to the present disclosure is useful as a bidirectional switch that is used in a matrix converter or the like.

What is claimed is:
1. A semiconductor device, comprising:
a bidirectional switch element;
a first protection element; and
a second protection element,
wherein the bidirectional switch element includes:
  a first compound semiconductor layer of n-type conductivity above a first substrate;
  a first electrode and a second electrode on the first compound semiconductor layer;
  a first gate electrode between the first electrode and the second electrode; and
  a second gate electrode between the first gate electrode and the second electrode,
conduction between the first electrode and the second electrode is controlled by voltages at the first gate electrode and the second gate electrode,
the first protection element includes:
  a second compound semiconductor layer of the n-type conductivity above a second substrate;
  a third electrode and a fourth electrode on the second compound semiconductor layer; and
  a third gate electrode between the third electrode and the fourth electrode,
conduction between the third electrode and the fourth electrode is controlled by a voltage at the third gate electrode,
the second protection element includes:
  a third compound semiconductor layer of the n-type conductivity above a third substrate;
  a fifth electrode and a sixth electrode on the third compound semiconductor layer; and a fourth gate electrode between the fifth electrode and the sixth electrode, conduction between the fifth electrode and the sixth electrode is controlled by a voltage at the fourth gate electrode, a sum of a withstand voltage between the fourth electrode and one of the third electrode and the third gate electrode and a withstand voltage between the sixth electrode and one of the fifth electrode and the fourth gate electrode is greater than or equal to a maximum applicable voltage between one of the first electrode and the first gate electrode and one of the second electrode and the second gate electrode, the first gate electrode and the second gate electrode form one of Schottky junction and p-n junction with the first compound semiconductor layer, the third gate electrode forms one of the Schottky junction and the p-n junction with the second compound semiconductor layer, the fourth gate electrode forms one of the Schottky junction and the p-n junction with the third compound semiconductor layer, the first electrode is electrically connected to the third gate electrode, the first gate electrode is electrically connected to the third electrode, the second electrode is electrically connected to the fourth gate electrode, the second gate electrode is electrically connected to the fifth electrode, and the fourth electrode is electrically connected to the sixth electrode.

2. The semiconductor device according to claim 1, wherein a sum of a distance between the third gate electrode and the fourth electrode and a distance between the fourth gate electrode and the sixth electrode is greater than or equal to a distance between the first gate electrode and the second gate electrode.

3. The semiconductor device according to claim 1, wherein a first voltage drop element is inserted into a path connecting the first electrode, the third gate electrode, the third electrode, and the first gate electrode, and a second voltage drop element is inserted into a path connecting the second electrode, the fourth gate electrode, the fifth electrode, and the second gate electrode.

4. The semiconductor device according to claim 1, wherein a third voltage drop element is inserted into a path connecting the first electrode and the third gate electrode, and a fourth voltage drop element is inserted into a path connecting the second electrode and the fourth gate electrode.

5. The semiconductor device according to claim 2, wherein a first voltage drop element is inserted into a path connecting the first electrode, the third gate electrode, the third electrode, and the first gate electrode, and a second voltage drop element is inserted into a path connecting the second electrode, the fourth gate electrode, the fifth electrode, and the second gate electrode.

6. The semiconductor device according to claim 2, wherein a third voltage drop element is inserted into a path connecting the first electrode and the third gate electrode, and a fourth voltage drop element is inserted into a path connecting the second electrode and the fourth gate electrode.

7. The semiconductor device according to claim 1, wherein at least one of the first compound semiconductor layer, the second compound semiconductor layer, and the third compound semiconductor layer includes:

a channel layer; and a barrier layer disposed on the channel layer, the barrier layer having a band gap wider than a band gap of the channel layer.

8. The semiconductor device according to claim 1, wherein at least one of the first gate electrode, the second gate electrode, the third gate electrode, and the fourth gate electrode includes a p-type semiconductor layer selectively disposed between the at least one of the first gate electrode, the second gate electrode, the third gate electrode, and the fourth gate electrode, and one of the first compound semiconductor layer, the second compound semiconductor layer, and the third compound semiconductor layer.

9. The semiconductor device according to claim 1, wherein the first substrate, the second substrate, and the third substrate are the same substrate.

10. The semiconductor device according to claim 2, wherein the first substrate, the second substrate, and the third substrate are the same substrate.

11. A semiconductor device, comprising:
a bidirectional switch element; and
a protection element,
wherein the bidirectional switch element includes:
a first compound semiconductor layer of n-type conductivity above a first substrate;
a first electrode and a second electrode on the first compound semiconductor layer;
a first gate electrode between the first electrode and the second electrode; and
a second gate electrode between the first gate electrode and the second electrode, conduction between the first electrode and the second electrode is controlled by voltages at the first gate electrode and the second gate electrode, the protection element includes:
a fourth compound semiconductor layer of the n-type conductivity above a second substrate;
a seventh electrode and an eighth electrode on the fourth compound semiconductor layer;
a fifth gate electrode between the seventh electrode and the eighth electrode; and
a sixth gate electrode between the fifth gate electrode and the eighth electrode, conduction between the seventh electrode and the eighth electrode is controlled by voltages at the fifth gate electrode and the sixth gate electrode, a withstand voltage between two electrodes of the protection element that include one of the seventh electrode and the fifth gate electrode and one of the eighth electrode and the sixth gate electrode is greater than or equal to a maximum applicable voltage between two electrodes of the bidirectional switch element that include one of the first electrode and the first gate electrode and one of the second electrode and the second gate electrode, the first gate electrode and the second gate electrode form one of Schottky junction and p-n junction with the first compound semiconductor layer, the fifth gate electrode and the sixth gate electrode form one of the Schottky junction and the p-n junction with the fourth compound semiconductor layer, the first electrode is electrically connected to the fifth gate electrode, the second electrode is electrically connected to the sixth gate electrode, the first gate electrode is electrically connected to the seventh electrode, and the second gate electrode is electrically connected to the eighth electrode.

12. The semiconductor device according to claim 11, wherein a distance between the fifth gate electrode and the sixth gate electrode is greater than or equal to a distance between the first gate electrode and the second gate electrode.

13. The semiconductor device according to claim 11, wherein a fifth voltage drop element is inserted into a path connecting the first electrode, the fifth gate electrode, the seventh electrode, and the first gate electrode, and a sixth voltage drop element is inserted into a path connecting the second electrode, the sixth gate electrode, the eighth electrode, and the second gate electrode.

14. The semiconductor device according to claim 11, wherein a seventh voltage drop element is inserted into a path connecting the first electrode and the fifth gate electrode, and an eighth voltage drop element is inserted into a path connecting the second electrode and the sixth gate electrode.

15. The semiconductor device according to claim 12, wherein a fifth voltage drop element is inserted into a path connecting the first electrode, the fifth gate electrode, the seventh electrode, and the first gate electrode, and a sixth voltage drop element is inserted into a path connecting the second electrode, the sixth gate electrode, the eighth electrode, and the second gate electrode.

16. The semiconductor device according to claim 12, wherein a seventh voltage drop element is inserted into a path connecting the first electrode and the fifth gate electrode, and an eighth voltage drop element is inserted into a path connecting the second electrode and the sixth gate electrode.

17. The semiconductor device according to claim 11, wherein at least one of the first compound semiconductor layer and the fourth compound semiconductor layer includes:

a channel layer; and a barrier layer disposed on the channel layer, the barrier layer having a band gap wider than a band gap of the channel layer.

18. The semiconductor device according to claim 11, wherein at least one of the first gate electrode, the second gate electrode, the fifth gate electrode, and the sixth gate electrode includes a p-type semiconductor layer selectively disposed between the at least one of the first gate electrode, the second gate electrode, the fifth gate electrode, and the sixth gate electrode, and one of the first compound semiconductor layer and the fourth compound semiconductor layer.

19. The semiconductor device according to claim 11, wherein the first substrate and the second substrate are the same substrate.

20. The semiconductor device according to claim 12, wherein the first substrate and the second substrate are the same substrate.

* * * * *